(12) United States Patent
Cheng et al.

(10) Patent No.: US 8,558,289 B2
(45) Date of Patent: Oct. 15, 2013

(54) TRANSISTORS HAVING A COMPOSITE STRAIN STRUCTURE, INTEGRATED CIRCUITS, AND FABRICATION METHODS THEREOF

(75) Inventors: Chun-Fai Cheng, Hsinchu (TW); Hsueh-Chang Sung, Zhubei (TW); Kuan-Yu Chen, Taipei (TW); Hsien-Hsin Lin, Hsinchu (TW); Fung Ka Hing, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 316 days.

(21) Appl. No.: 12/795,088

(22) Filed: Jun. 7, 2010

(65) Prior Publication Data

US 2011/0024801 A1 Feb. 3, 2011

Related U.S. Application Data

(60) Provisional application No. 61/230,003, filed on Jul. 30, 2009.

(51) Int. Cl.
*H01L 29/76* (2006.01)
*H01L 21/336* (2006.01)

(52) U.S. Cl.
USPC ............ 257/255; 257/E29.255; 257/E21.409; 438/197

(58) Field of Classification Search
USPC ............ 257/255, E29.255, E21.409; 438/197
See application file for complete search history.

(56) References Cited

U.S. PATENT DOCUMENTS

| | | | |
|---|---|---|---|
| 6,946,350 B2 | 9/2005 | Lindert et al. | |
| 7,335,959 B2 | 2/2008 | Curello et al. | |
| 7,494,858 B2 | 2/2009 | Bohr et al. | |
| 2006/0076622 A1* | 4/2006 | Wang et al. | 257/347 |
| 2007/0012913 A1* | 1/2007 | Ohta et al. | 257/19 |
| 2007/0235802 A1* | 10/2007 | Chong et al. | 257/346 |
| 2008/0128746 A1* | 6/2008 | Wang | 257/190 |
| 2008/0246057 A1* | 10/2008 | Lin et al. | 257/190 |
| 2010/0193876 A1* | 8/2010 | Ramani et al. | 257/377 |

* cited by examiner

*Primary Examiner* — Victor A Mandala
*Assistant Examiner* — Whitney T Moore
(74) *Attorney, Agent, or Firm* — Lowe Hauptman & Ham, LLP

(57) ABSTRACT

A transistor includes a gate electrode disposed over a substrate. At least one composite strain structure is disposed adjacent to a channel below the gate electrode. The at least one composite strain structure includes a first strain region within the substrate. A second strain region is disposed over the first strain region. At least a portion of the second strain region is disposed within the substrate.

21 Claims, 5 Drawing Sheets

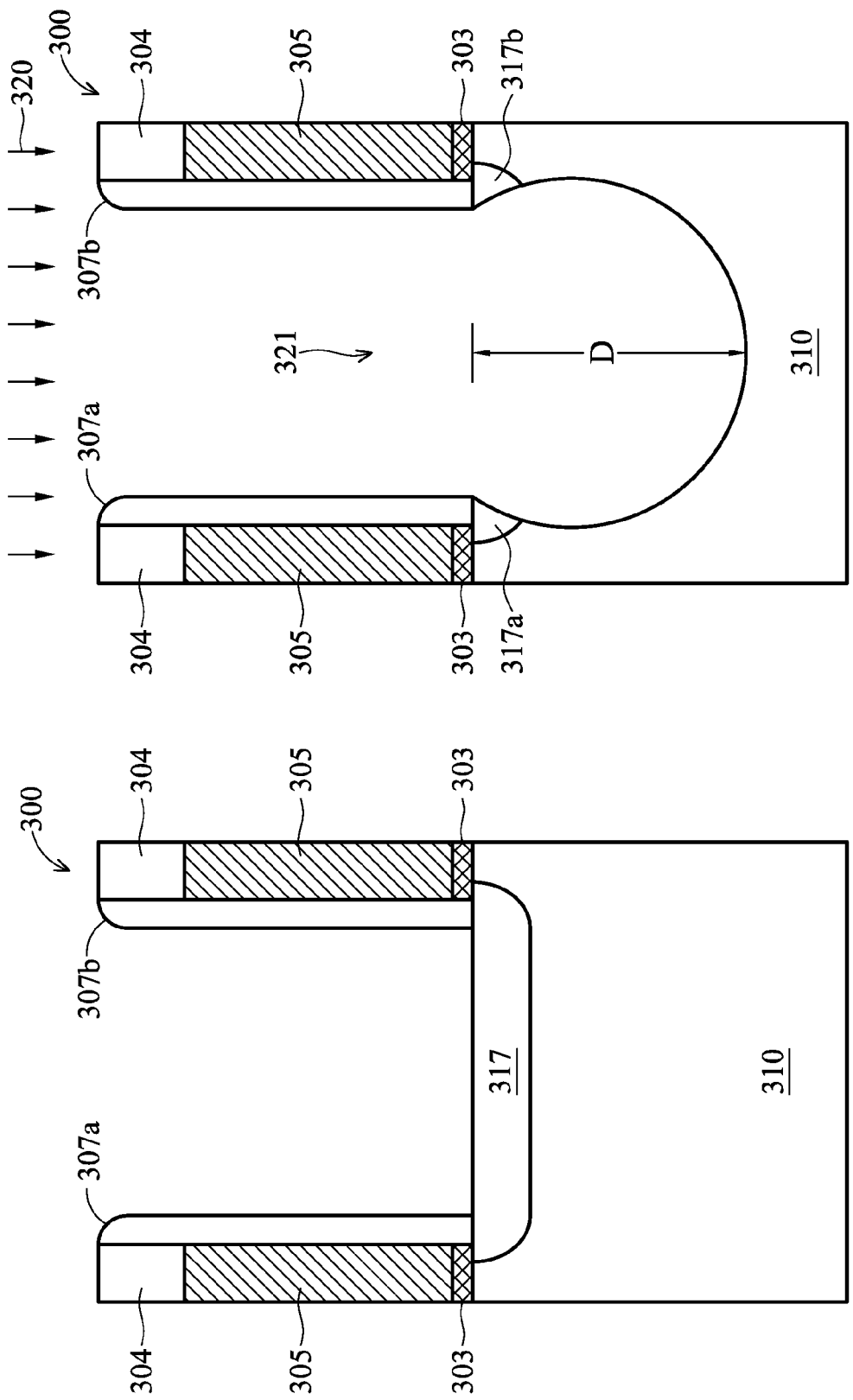

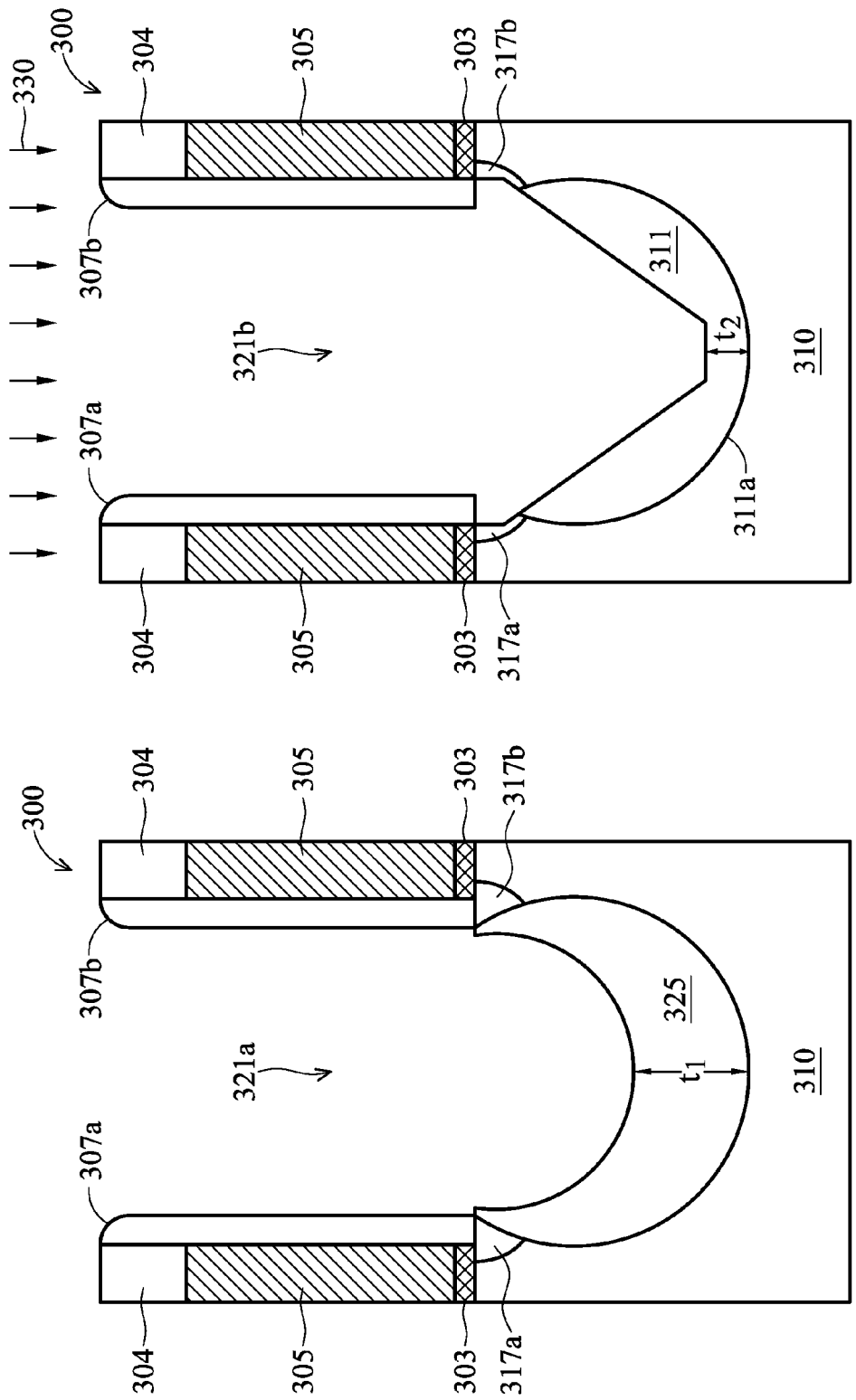

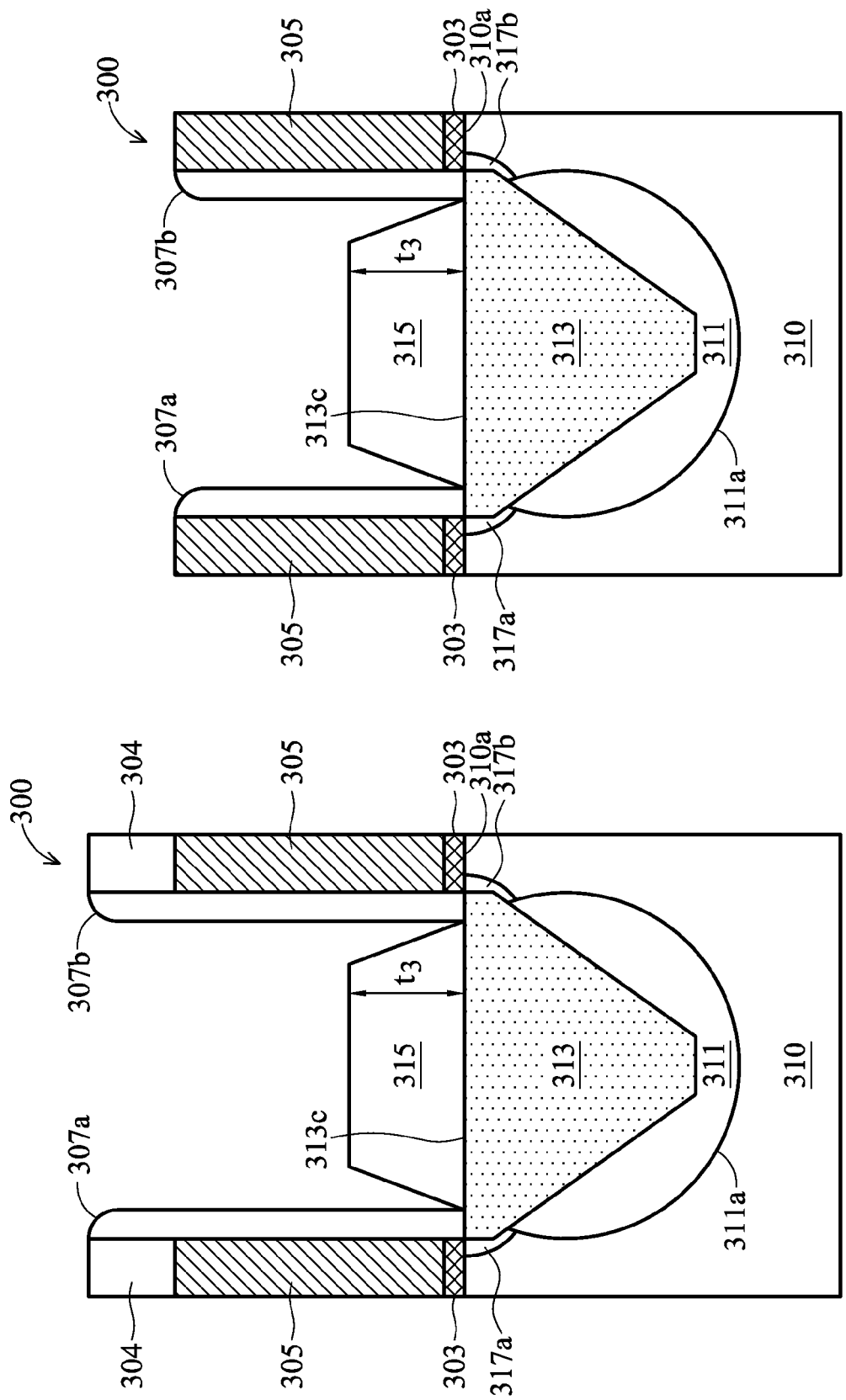

TRANSISTORS HAVING A COMPOSITE STRAIN STRUCTURE, INTEGRATED CIRCUITS, AND FABRICATION METHODS THEREOF

CROSS-REFERENCE TO RELATED APPLICATIONS

The present application claims priority of U.S. Provisional Patent Application Ser. No. 61/230,003 filed on Jul. 30, 2009 which is incorporated herein by reference in its entirety.

FIELD

The present disclosure relates generally to the field of semiconductor circuits, and more particularly, to transistors having a composite strain structure, integrated circuits, and fabrication methods thereof.

BACKGROUND

An integrated circuit (IC) is formed by creating one or more devices (e.g., circuit components) on a semiconductor substrate using a fabrication process. As fabrication processes and materials improve, semiconductor device geometries continue to decrease in size since such devices were first introduced several decades ago. For example, current fabrication processes are producing devices having feature geometry sizes (e.g., the smallest component (or line) that may be created using the process) of less than 90 nm. However, the reduction in size of device geometries frequently introduces new challenges that need to be overcome.

As microelectronic device geometries are scaled below 65 nm, the electrical efficiency becomes an issue that impacts device performance. Microelectronic device performance such as current gain can be significantly affected by the configuration and materials comprising and incorporated into microelectronic devices. To enhance the electrical efficiency, a strained silicon-germanium layer has been proposed to provide a compressive stress to a channel of a transistor for providing a desired electronic mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIGS. 3A-3F are schematic cross-sectional views illustrating an exemplary method for forming at least one composite strain structure disposed adjacent to a channel below the gate electrode.

DETAILED DESCRIPTION

Figure 1:
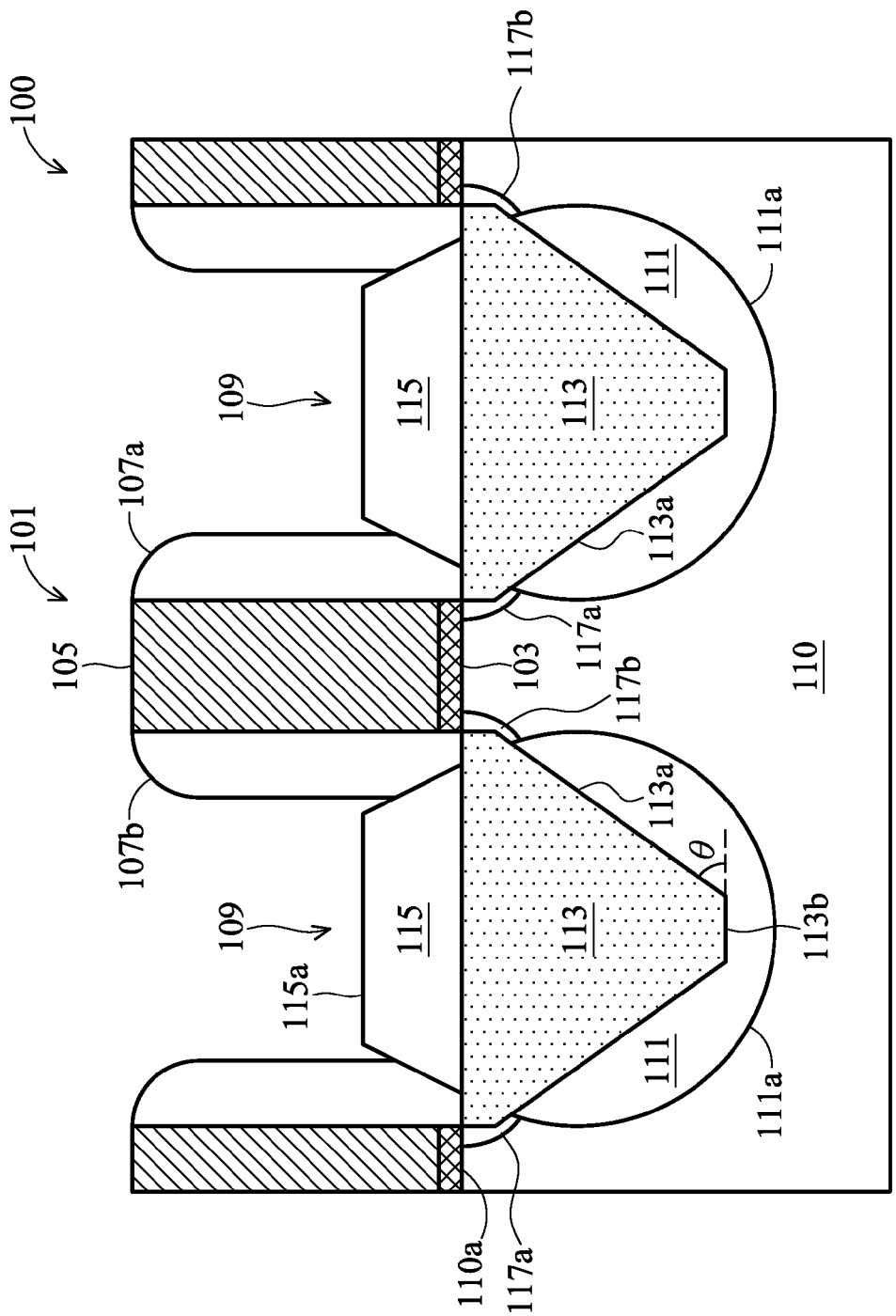
FIG. 1 is a schematic cross-sectional view of an exemplary integrated circuit including at least one transistor having a composite strain structure.

A conventional transistor that has a strained channel has been proposed. The conventional transistor has a silicon-germanium source and a silicon-germanium drain. Each of the silicon-germanium source and drain is a single strain layer. Each of the strain silicon-germanium source and drain has $\{111\}$ facets in a substrate. The $\{111\}$ facets form a V shape within the substrate. The $\{111\}$ facets are formed by a wet etch. The wet etch uses the $\{111\}$ facets as an etch stop.

It is found that the silicon-germanium source/drain can be confined between two neighboring transistor gates. If the space of the neighboring transistor gates is reduced, the volume of the silicon-germanium source/drain could become smaller due to the $\{111\}$ facets. The small volume of the silicon-germanium source/drain may not provide a desired compressive stress to the channel of the transistor.

Based on the foregoing, transistors having a composite strain structure, integrated circuits, and fabrication methods thereof are desired.

It is understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view of an exemplary integrated circuit including at least one transistor having a composite strain structure. In FIG. 1, an integrated circuit 100 can include at least one transistor, e.g., transistors 101. The integrated circuit 100 can include a processor, a central processing unit (CPU), a driver circuit, a decoder, a converter, a graphic circuit, a telecommunication circuit, a read only memory (ROM) circuit, a static random access memory (SRAM) circuit, an embedded SRAM circuit, dynamic random access memory (DRAM) circuit, an embedded DRAM circuit, a non-volatile memory circuit, e.g., FLASH, EPROM, E²PROME, a field-programmable gate array circuit, a logic array circuit, and/or other integrated circuit.

Referring to FIG. 1, each of the transistors 101 can include a gate electrode 105 disposed over a substrate 110. At least one composite strain structure, e.g., composite strain structures 109, can be disposed adjacent to a channel below the electrode 105. The composite strain structures 109 can provide a desired compressive or tensile stress to a channel (not labeled) of the transistor 101. In some embodiments, each of the composite strain structures 109 can include a first strain region, e.g., a strain region 111, and a second strain region, e.g., a strain region 113. The strain region 111 can be disposed within the substrate 110. The strain region 113 can be disposed over the strain region 111. At least a portion of the strain region 113 can be disposed within the substrate 110. In some embodiments, the strain region 111 and/or the strain region 113 can be referred to as a source/drain (S/D) region.

The substrate 110 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In some embodiments, the strain region 111 can include an undoped strain region. The strain region 113 can include a doped strain region. The strain region 113 can have a stress that is larger than that of the strain region 111. In some embodiments using a PMOS transistor, the strain region 111 can include a silicon-germanium ($Si_{1-x}Ge_x$) region. The strain region 111 can have a germanium component between about 15 atomic % and about 35 atomic %. The strain region 113 can have a germanium component between about 25 atomic % and about 45 atomic %. The strain region 113 can have a p-type dopant component, e.g., boron (B), between about 5E19 atoms/cm$^3$ and about 5E20 atoms/cm$^3$. In other embodiments, the strain region 111 can include a doped region, e.g., an n-type doped region. In still other embodiments, the strain region 111 can include a doped region, e.g., a p-type doped region.

In other embodiments using an NMOS transistor, the strain region 111 can include a silicon carbide (SiC) region. The strain region 111 can have a carbon component between about 0.5 atomic % and about 1.5 atomic %. The strain region 113 can have a carbon component between about 0.5 atomic % and about 3 atomic %. The strain region 113 can have an n-type dopant component, e.g., phosphorus (P), between about 5E19 atoms/cm$^3$ and about 5E20 atoms/cm$^3$. In other embodiments, the strain region 111 can include a doped region, e.g., a p-type doped region. In still other embodiments, the strain region 111 can include a doped region, e.g., an n-type doped region.

As noted, the conventional transistor has silicon-germanium source and drain. Each of the silicon-germanium source and drain consists of a single strain layer. In contrary to the conventional transistor, the transistor 101 has the composite strain structures 109. Either or both of the strain regions 111 and 113 can provide desired compressive or tensile stresses to the channel of the transistor 101. It is unexpectedly found that the composite strain structure 109 can provide a stress volume that is larger than the stress volume of the silicon-germanium source/drain of the conventional transistor. In a simulation using a PMOS transistor formed by 22-nm technology and having a germanium component of about 30 atomic %, a relative drive current gain of the transistor 101 can be increased by about 10% by comparing with the conventional transistor. From the foregoing, the electrical performance, e.g., electronic mobility and/or current, of the transistor 101 can be achieved.

It is noted that the atomic percentages of stress components and the dopant concentrations described above are merely exemplary. One of skill in the art can modify the atomic percentages of stress components and the dopant concentrations to achieve a desired compressive or tensile stress to the channel of the transistor.

In some embodiments, a bottom portion 111a of the strain region 111 can have a substantially circular shape. In other embodiments, the bottom portion 111a of the strain region 111 can have a V shape, a U shape, an elliptical shape, a vessel shape, a cylindrical shape, a round-bottom flask shape, a conical flash shape, a rectangular shape, a square shape, or other desired shape.

Referring to FIG. 1, the strain region 113 can have a facet 113a in a {111} crystallographic plane of the substrate 110. In some embodiments, the facet 113a and a horizontal line can have an angle θ between about 50° and about 60°. The strain region 113 can have a bottom surface 113b. The bottom surface 113b can be a flat surface, a tip surface, a round surface, or other shape surface. In other embodiments, the bottom surface 113b of the strain region 113 can extend over the bottom portion 111a of the strain region 111.

In some embodiments, the transistor 101 can include a doped region 115. The doped region 115 can be disposed over the strain region 113. A surface 115a of the doped region 115 can be over a surface 110a of the substrate 100. The doped region 115 can be provided for a salicide formation. The doped region 115 can include at least one material component, such as silicon, silicon germanium, silicon carbide, and/or other material component. In some embodiments using a PMOS transistor, the doped region 115 can have a germanium component of about 25 atomic % or less. The doped region 113 can have a p-type dopant component, e.g., boron (B), between about 5E19 atoms/cm$^3$ and about 5E20 atoms/cm$^3$.

In some embodiments, the transistor 101 can include at least one lightly-doped drain (LDD) region, e.g., LDD regions 117a and 117b. At least portions of the LDD regions 117a and 117b can be disposed below the gate electrode 105. In some embodiments, the strain region 113 can extend adjacent to the LDD regions 117a and 117b. The strain region 113 can desirably provide the compressive or tensile stress to the channel region of the transistor 101 through the LDD regions 117a and 117b.

Referring to FIG. 1, the transistor 101 can include a gate dielectric 103 below the gate electrode 105. The gate dielectric 103 can include at least one material such as oxide, nitride, oxynitride, and other gate dielectric material. In some embodiments, the gate dielectric 103 can include an interfacial layer, e.g., a silicon oxide layer and a high-k dielectric layer disposed over the interfacial layer. In some embodiments, the high-k dielectric layer may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. In some embodiments, the gate electrode 105 can include at least one material such as polysilicon, Ti, TiN, TaN, Ta, TaC, TaSiN, W, WN, MoN, MoON, RuO$_2$, and/or other suitable materials.

Referring to FIG. 1, spacers 107a and 107b can be formed on sidewalls of the gate electrode 105. The spacers 107a and 107b can include at least one material such as oxide, nitride, oxynitride, and/or other suitable dielectric material.

Figure 2:
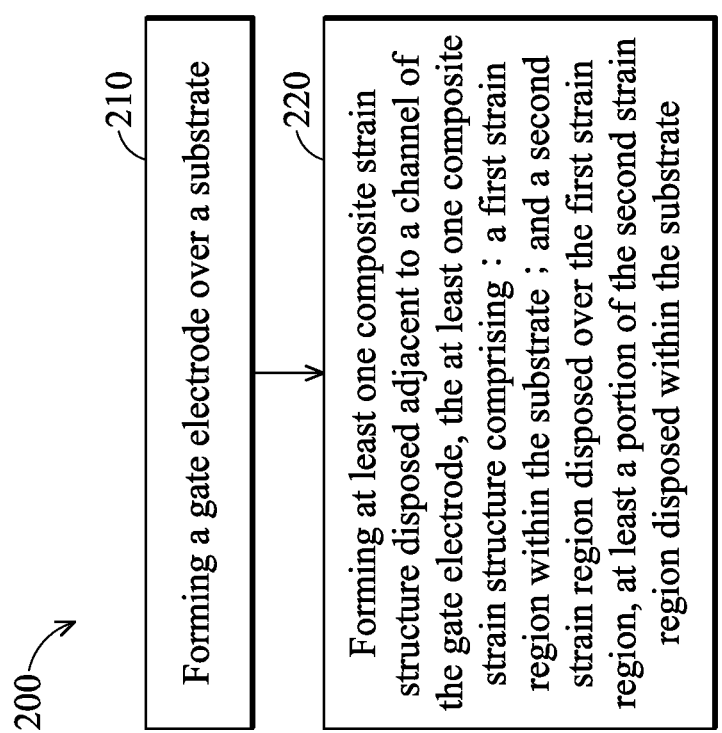
FIG. 2 is a flowchart showing an exemplary method for forming an integrated circuit including at least one transistor having a composite strain structure.

FIG. 2 is a flowchart showing a method for forming an exemplary integrated circuit including at least one transistor having a composite strain structure. In FIG. 2, a method 200 can include a process 210 and a process 220. The process 210 can form a gate electrode over a substrate. The gate electrode can be formed using processes such as, deposition, photolithography, wet etching, dry etching (e.g., reactive ion etch (RIE)), plasma etching, and/or other suitable processes. The process 210 can be a gate-first process or a gate-last process. The process 220 can form at least one composite strain structure disposed adjacent to a channel below the gate electrode. The at least one composite strain structure comprises a first strain region within the substrate. A second strain region can be disposed over the first strain region. At least a portion of the second strain region can be disposed within the substrate.

FIGS. 3A-3F are schematic cross-sectional views illustrating an exemplary method for forming at least one composite strain structure disposed adjacent to a channel below the gate electrode. Items of FIGS. 3A-3F that are the same items in FIG. 1 are indicated by the same reference numerals, increased by 200. In FIG. 3A, mask layers 304 can be formed over gate electrodes 305. The mask layers 304 can include at least one material such as oxide, nitride, oxynitride, and/or other suitable dielectric material. The mask layers 304 can be formed by, for example, a CVD process.

After the formation of the mask layers 304 and the gate electrodes 305, an LDD layer 317 can be formed within a substrate 310. The LDD layer 317 can be formed by, for example, an ion implantation process. For embodiments forming a PMOS transistor, the LDD layer 317 can include at least one dopant such as boron (B) and/or group III element. For embodiments forming an NMOS transistor, the LDD layer 317 can have dopants such as Arsenic (As), Phosphorus (P), other group V element, or the combinations thereof.

After the formation of the LDD layer 317, spacers 307a and 307b are formed by deposition and etching process. The spacers 307a and 307b can include at least one material such as oxide, nitride, oxynitride, and/or other suitable dielectric material. The spacers 307a and 307b can be formed by, for example, a CVD process. The mask layers 304 and the spacers 307a and 307b can desirably prevent a deposition of a strain layer and/or region on and/or over the gate electrodes 305.

In FIG. 3B, a removing process 320 can form an opening 321 within the substrate 310. The removing process 320 can remove a portion of the LDD layer 317 (shown in FIG. 3A), forming the LDD regions 317a and 317b. In some embodiments, the removing process 320 can isotropically etch the substrate 310 for forming the opening 321 within the substrate 310. The isotropic etch can include a dry etch process, a wet etch process, and/or any combinations thereof. In other embodiments, the removing process 320 can include an anisotropic etch process. Various shapes of the opening 321 can be formed by the removing process 320, which can include an isotropic etch process, an anisotropic etch process, and/or any combinations thereof. In some embodiments using 22-nm technology, the opening 321 may have a depth "D" between about 50 nm and about 80 nm. The mask layer 304 protects the gate 305 during the etching process.

Referring to FIG. 3C, a strain layer 325 can be formed within the opening 321, forming a depth-reduced opening 321a. The strain layer 325 can be formed by, for example, using silane (SiH$_4$) or disilane (Si$_2$H$_6$) and germane (GeH$_4$) as reactants. The strain layer 325 can be formed by, for example, an epitaxial process, a CVD such as plasma enhanced CVD (PECVD), atmospheric pressure CVD (APCVD), low pressure CVD (LPCVD), high density plasma CVD (HDPCVD), atomic layer CVD (ALCVD), other suitable deposition processes, and/or combinations thereof. In some embodiments using 22-nm technology, the strain layer 325 can have a bottom thickness "t$_1$" between about 20 nm to about 55 nm. The mask layer 304 protects the top portion of the gate 305 during the deposition and/or epitaxial process. The spacers 307a and 307b protect the sidewall of the gate 305 during the deposition and/or epitaxial process.

Referring to FIG. 3D, a removing process 330 can remove a portion of the strain layer 325 (shown in FIG. 3C), forming a strain region 311. An opening 321b is over the strain region 311. In some embodiments, the removing process 330 can remove portions of the LDD regions 317a and 317b. The removing process 330 can remove a portion of the strain layer 325 such that the strain region 311 can have {111} facets. In some embodiments, the removing process 330 can include a thermal etch process having a processing temperature between about 500° C. and about 800° C. The thermal etch process can use, for example, hydrogen chloride (HCl) as an etching gas having a flow rate from about 50 sccm to about 500 sccm and an etch catalyst, for example, germane (GeH$_4$) having a flow rate from about 10 sccm to about 100 sccm. In some embodiments using 22-nm technology, the strain region 311 can have a bottom thickness "t$_2$" between about 10 nm to about 40 nm. The gate 305 is protected by the mask 304 and the spacers 307a and 307b during the thermal etching process.

In some embodiments, the process for depositing the strain layer 325 (shown in FIG. 3C) and the removing process 330 can be performed in the same chamber. For example, after depositing the strain layer 325 in an epitaxial chamber the removing process 330 can be performed in the same epitaxial chamber. By performing the deposition and etching processes in the same chamber, the cycle time of forming integrated circuits can be desirably reduced. Particles and/or oxidation to the strain layer 325 can be desirably prevented. In other embodiments, the process for depositing the strain layer 325 and the removing process 330 can be performed in different chambers. The gate 305 is protected by the mask 304 and the spacers 307a and 307b during the deposition and/or epitaxial process.

Referring to FIG. 3E, a strain region 313 can be formed over the strain region 311. The strain region 313 can be formed within the opening 321b (shown in FIG. 3D). In some embodiments, a top surface 313c of the strain region 313 can be substantially level with a surface 310a of the substrate 310. In other embodiments, the top surface 313c of the strain region 313 can be higher or lower than the surface 310a of the substrate 310. The strain layer 313 can be formed by, for example, using silane (SiH$_4$) or disilane (Si$_2$H$_6$) and germane (GeH$_4$) as reactants. In some embodiments forming a p-type doped strain layer, a reactant including p-type dopant, e.g., borane (BH$_3$) or diborane (B$_2$H$_6$) can be added. The strain layer 313 can be formed by, for example, an epitaxial process, a CVD such as plasma enhanced CVD (PECVD), atmospheric pressure CVD (APCVD), low pressure CVD (LPCVD), high density plasma CVD (HDPCVD), atomic layer CVD (ALCVD), other suitable deposition processes, and/or combinations thereof.

Referring again to FIG. 3E, a doped region 315 can be formed over the strain region 313. The doped region 315 can be provided for the salicide formation. The strain layer 315 can be formed by, for example, using silane ($SiH_4$) or disilane ($Si_2H_6$) and germane ($GeH_4$) as reactants. In some embodiments forming a p-type doped strain layer, a reactant including p-type dopant, e.g., borane ($BH_3$) or diborane ($B_2H_6$) can be added. The strain layer 315 can be formed by, for example, an epitaxial process, a CVD such as plasma enhanced CVD (PECVD), atmospheric pressure CVD (APCVD), low pressure CVD (LPCVD), high density plasma CVD (HDPCVD), atomic layer CVD (ALCVD), other suitable deposition processes, and/or combinations thereof. In some embodiments using 22-nm technology, the strain layer 315 can have a thickness "$t_3$" between about 5 nm to about 25 nm.

Referring to FIG. 3F, the mask layers 304 (shown in FIG. 3E) can be removed. In some embodiments, additional spacers can be formed adjacent to the spacers 307a and 307b. A dielectric layer (not shown) can be formed over the structure shown in FIG. 3E. A removing process, e.g., a chemical mechanical polish (CMP) process, can remove the mask layers 304 and portions of the dielectric layer and spacers. In some embodiments, processes can be performed for forming an interconnect structure coupled with the structure shown in FIG. 3F.

It is noted that the depth and/or thickness described above in conjunction with FIGS. 3A-3F are merely exemplary. One of skill in the art can modify them to achieve desired sizes and/or dimensions of a transistor. It is also noted that the processing conditions, e.g., reactants, flow rates, and/or temperatures, described above are merely exemplary. One of skill in the art can modify the processing conditions to achieve desired shapes and/or features of the transistor.

Referring again to FIG. 1, the integrated circuit 100 can be disposed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system including the integrated circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
   a gate electrode disposed over a substrate;
   at least one composite strain structure disposed adjacent to a channel below the gate electrode, the at least one composite strain structure comprising:
   a first strain region within the substrate, wherein the first strain region is undoped; and
   a second strain region at least partially disposed over the first strain region; and
   a doped region over the second strain region.

2. The transistor of claim 1, wherein a surface of the doped region is over a surface of the substrate.

3. The transistor of claim 1, wherein the doped region includes germanium, the doped region has a germanium component of about 25 atomic % or less.

4. The transistor of claim 1, wherein the doped region includes germanium, the doped region has a carbon component of about 1 atomic % or less.

5. The transistor of claim 1, wherein the second strain region comprises a doped strain region, and a stress of the second strain region is larger than that of the first strain region.

6. The transistor of claim 5, wherein the first strain region has a germanium component between about 15 atomic % and about 35 atomic % and the second strain region has a germanium component between about 25 atomic % and about 45 atomic %.

7. The transistor of claim 5, wherein the first strain region has a carbon component between about 0.5 atomic % and about 1.5 atomic % and the second strain region has a carbon component between about 0.5 atomic % and about 3 atomic %.

8. The transistor of claim 1, wherein the second strain region comprises two facets, and each of the two facets is in a {111} crystallographic plane of the substrate.

9. The transistor of claim 1 further comprising a lightly-doped drain (LDD) region, wherein at least a portion of the LDD region is disposed below the gate electrode and the second strain region extends adjacent to the LDD region.

10. The transistor of claim 1, wherein the second strain region has two facets facing the first strain region, each of the two facets is aligned with a corresponding crystallographic plane of the substrate, and the two facets of the second strain region form a V shape.

11. A transistor comprising:
    a gate electrode disposed over a substrate; and
    at least one composite strain structure disposed adjacent to a channel below the gate electrode, the at least one composite strain structure comprising:
    a first strain region within the substrate, a bottom portion of the first strain region having a circular shape, wherein the first strain region is undoped; and
    a second strain region disposed over the first strain region, at least a portion of the second strain region being disposed within the substrate, wherein the second strain region comprises a facet in a {111} crystallographic plane of the substrate, and an angle between the facet and a horizontal reference line of the substrate is between about 50-degrees and about 60-degrees.

12. The transistor of claim 11 further comprising a doped region disposed over the second strain region, wherein a surface of the doped region is over a surface of the substrate.

13. The transistor of claim 11, wherein the second strain region comprises a doped strain region, and a stress of the second strain region is larger than that of the first strain region.

14. A method for forming a transistor, the method comprising:
    forming a gate electrode over a substrate;

forming at least one composite strain structure, disposed adjacent to a channel below the gate electrode, comprising:
  forming a first strain region within the substrate, the first strain region is configured to provide a first stress to the channel; and
  forming a second strain region at least partially over the first strain region, the second strain region is configured to provide a second stress to the channel, the second stress being greater than the first stress; and
forming a doped region over the second strain region.

15. The method of claim 14, wherein a surface of the doped region is over a surface of the substrate.

16. The method of claim 14, wherein forming the first strain region comprises
  forming an opening within the substrate;
  forming a first strain layer within the opening; and
  removing a portion of the first strain layer for forming the first strain region.

17. The method of claim 16, wherein forming the opening within the substrate comprises isotropically etching the substrate for forming the opening within the substrate.

18. The method of claim 16, wherein removing the portion of the first strain layer comprises thermally etching the first strain layer for forming the first strain region.

19. The method of claim 18, wherein thermally etching the first strain layer includes a processing temperature between about 500° C. and about 800° C.

20. The method of claim 18, wherein forming the first strain layer and thermally etching the first strain layer are performed in the same chamber.

21. The transistor of claim 14, wherein the first strain region is undoped.

* * * * *